United States Patent
Hwang et al.

(10) Patent No.: US 12,521,520 B2
(45) Date of Patent: Jan. 13, 2026

(54) CATHETER PACKAGING HAVING ALIGNMENT FEATURES

(71) Applicant: CANON U.S.A., INC., Melville, NY (US)

(72) Inventors: Charles George Hwang, Wellesley, MA (US); Takahisa Kato, Brookline, MA (US)

(73) Assignee: Canon U.S.A., Inc., Melville, NY (US)

( * ) Notice: Subject to any disclaimer, the term of this patent is extended or adjusted under 35 U.S.C. 154(b) by 543 days.

(21) Appl. No.: 18/065,290

(22) Filed: Dec. 13, 2022

(65) Prior Publication Data
US 2023/0201522 A1      Jun. 29, 2023

Related U.S. Application Data

(60) Provisional application No. 63/294,472, filed on Dec. 29, 2021.

(51) Int. Cl.
| | | |
|---|---|---|
| *A61M 25/00* | (2006.01) | |
| *A61B 34/30* | (2016.01) | |
| *A61M 25/01* | (2006.01) | |

(52) U.S. Cl.
CPC .......... *A61M 25/002* (2013.01); *A61B 34/30* (2016.02); *A61B 2034/301* (2016.02); *A61M 25/0138* (2013.01); *A61M 25/0147* (2013.01)

(58) Field of Classification Search
CPC ..... A61B 1/00; A61B 34/30; A61B 2034/301; A61M 25/002; A61M 25/0138; A61M 25/0147

(Continued)

(56) References Cited

U.S. PATENT DOCUMENTS

| | | |
|---|---|---|
| 5,497,601 A | 3/1996 | Gonzalez |
| 5,846,221 A | 12/1998 | Snoke et al. |

(Continued)

FOREIGN PATENT DOCUMENTS

| | | |
|---|---|---|
| JP | 2021-133248 A | 9/2021 |
| WO | 2018/079083 A1 | 5/2018 |

OTHER PUBLICATIONS

Hu, X., et al., "Steerable catheters for minimally invasive surgery: a review and future directions", Computer Assisted Surgery, 2018, pp. 21-41, vol. 23, No. 1.

*Primary Examiner* — Bryon P Gehman
(74) *Attorney, Agent, or Firm* — Canon U.S.A., Inc., IP Division

(57) ABSTRACT

A packaging assembly for storing a steerable catheter ready for connection with a robotic system, comprises: a packaging enclosure and an alignment member configured to hold the steerable catheter in a predetermined shape. The alignment member is a carrier tube configured to align one end of the steerable catheter for connection with an actuator unit. The package and the alignment member are designed such that the steerable catheter can be connected to the actuator unit without changing the predetermined shape and while the catheter is still in the package. A robotic system is configured to connect to the steerable catheter included in the packaging assembly. The robotic system completes an initialization process to set acceptor parts of the actuator unit to a position corresponding to the predetermined shape in which the catheter is packaged.

20 Claims, 6 Drawing Sheets

(58) Field of Classification Search
    USPC .................................................. 206/363–370
    See application file for complete search history.

(56) References Cited

U.S. PATENT DOCUMENTS

| | | | |
|---|---|---|---|
| 7,077,856 | B2 | 7/2006 | Whitman |
| 9,848,904 | B2 * | 12/2017 | Aljuri ................ A61B 18/1485 |
| 10,687,694 | B2 | 6/2020 | Tanaka et al. |
| 10,869,925 | B2 | 12/2020 | Cully et al. |
| 11,007,641 | B2 | 5/2021 | Takagi et al. |
| 11,051,892 | B2 | 7/2021 | Hata et al. |
| 11,103,992 | B2 | 8/2021 | Tanaka et al. |
| 12,089,817 | B2 * | 9/2024 | Hwang .............. A61B 1/00105 |
| 12,186,043 | B2 * | 1/2025 | Hwang ................ A61B 34/74 |
| 2002/0062062 | A1 | 5/2002 | Belson et al. |
| 2008/0287798 | A1 | 11/2008 | Lee et al. |
| 2015/0273180 | A1 | 10/2015 | Schonfeldt |
| 2015/0352316 | A1 | 12/2015 | Terzibashian |
| 2018/0177977 | A1 | 6/2018 | De Soto |
| 2019/0262577 | A1 | 8/2019 | Anderson |
| 2021/0121051 | A1 | 4/2021 | Altshuler et al. |

\* cited by examiner

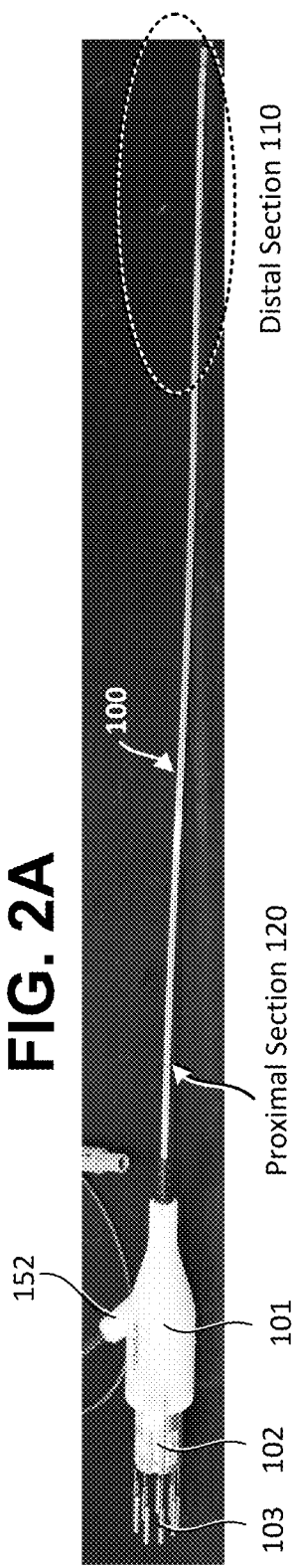
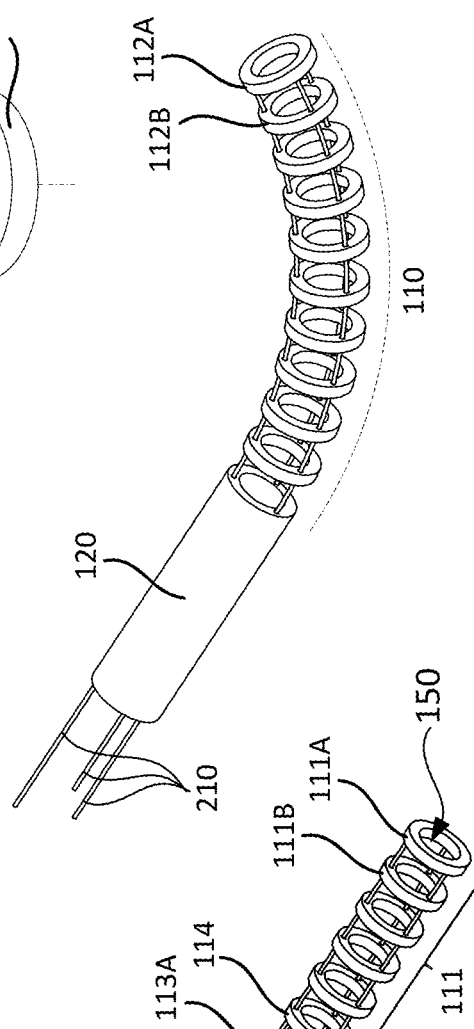
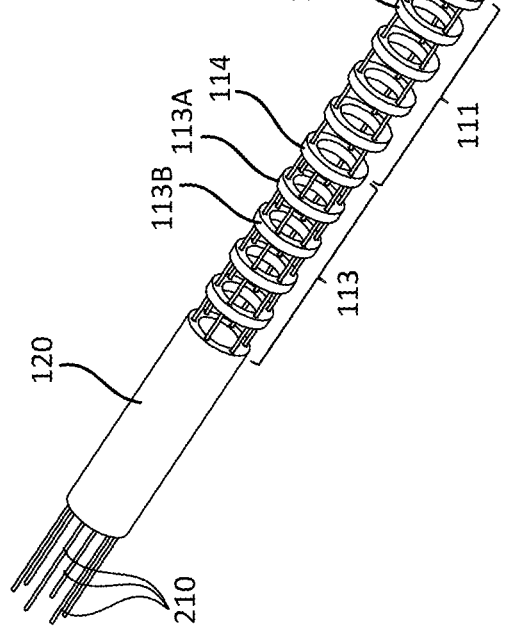

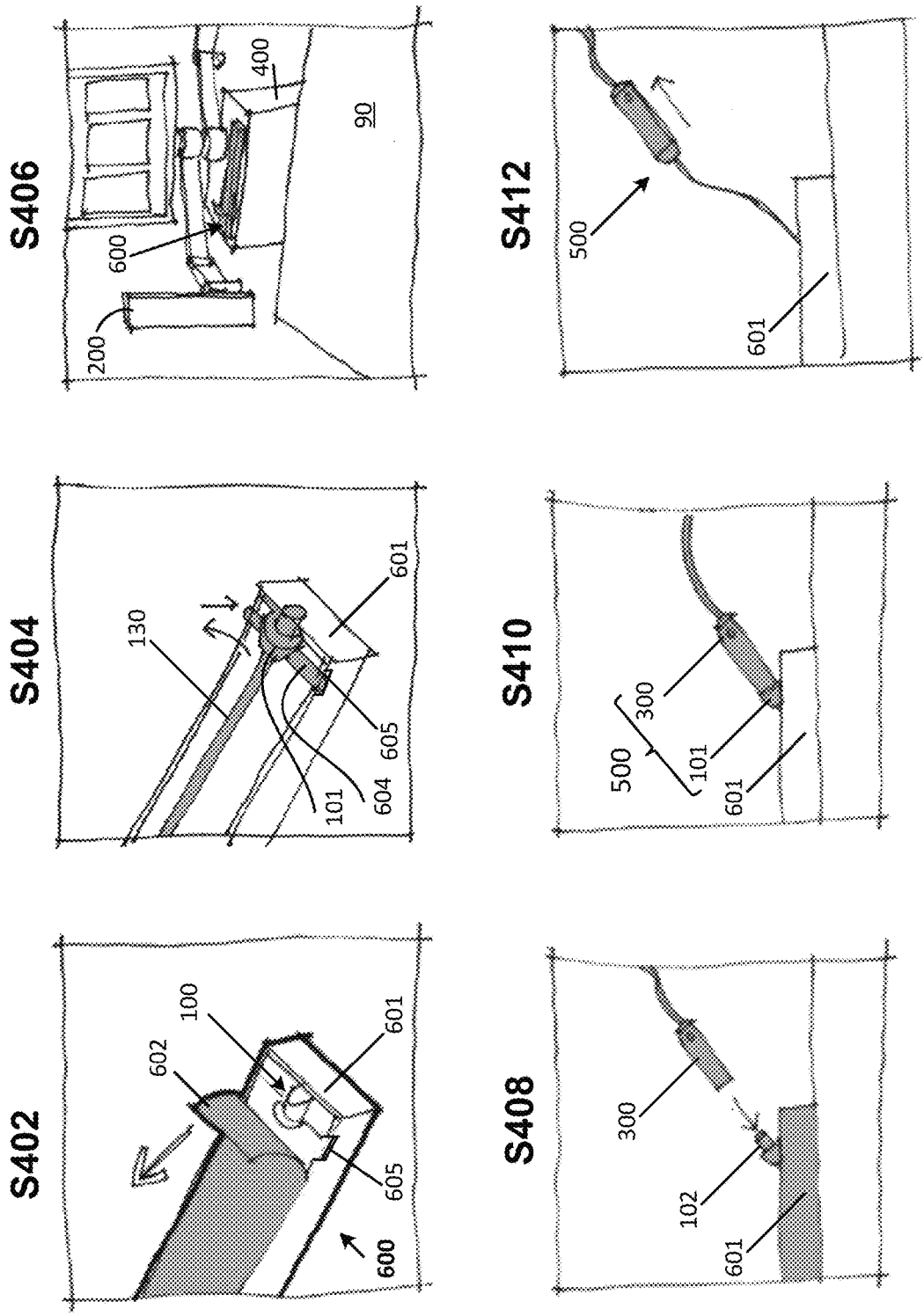

CATHETER PACKAGING HAVING ALIGNMENT FEATURES

CROSS-REFERENCE TO RELATED APPLICATIONS

This application is related to, and claims priority from, U.S. Provisional Application Ser. No. 63/294,472, filed Dec. 29, 2021, the content of which is herein incorporated by reference in its entirety.

BACKGROUND INFORMATION

Field of Disclosure

The present disclosure relates to medical devices. More specifically, the disclosure is directed to catheter packaging for steerable catheters, in particular robotically controlled catheters, and methods of using such catheter packaging during attachment of such steerable catheters to a robotic actuator.

Description of Related Art

In the field of medical devices, sterile packaging is an important aspect that determines, at least in part, the outcome of patient care. To that end, it is well known that medical devices, including surgical instruments, medical supplies, and the like, are generally shipped from the manufacturer to medical service providers in sterile packaging. While conventional sterile packaging for medical devices of unchanging form factor is well established, special requirements exist for newer medical devices of diverse form factors. For example, catheter assemblies are available in a variety of shapes and sizes ranging from lengths of below 100 centimeters (cm) to several meters (m), and therefore such assemblies are generally shipped in a sterile packaging having a coiled configuration. Examples of catheter packaging have been described in previously published patents and patent application publications including, but not limited to, US 2002/0062062, US 2015/0352316, US 2015/0273180, U.S. Pat. Nos. 4,858,821, 5,846,221, 10,780,245, 10,869,925, among others.

During removal of sterile packaging, care must be taken for unwrapping and uncoiling the catheter prior to use. If a catheter is inadvertently bent, kinked, or otherwise damaged during packaging removal, the catheter may no longer be suitable for use. The foregoing considerations about sterile packaging become even more important in robotically controlled steerable catheters due to the high cost and complexity of components used to manufacture such robotic catheters.

Most of the robotically controlled catheters or endoscopes rely on pushing and/or pulling drive wires (also called tendons or tendon wires) to manipulate the shape of the tip of the instrument. A steerable catheter can contain a multiplicity of drive wires that manipulate different sections of the catheter body allowing for complex shapes. Often the catheter body containing the drive wires is sterile and disposable, while the drive mechanism or actuator unit is part of capital equipment non-disposable and potentially non-sterile. Therefore, every time a steerable catheter is used, each of the individual drive wires has to be manually connected to its corresponding actuator by a user. This process is cumbersome for the user, can potentially void the sterility of the catheter, and it is likely that the user could make an error and fail to properly lock one or more of the wires to the actuators causing a malfunction or potential damage to the instrument or the patient.

A type of robotic catheter is known as a snake robot or continuum robot. Examples of a snake or continuum robot are described in U.S. Pat. Nos. 10,687,694, 11,007,641 and 11,130,992 disclosed by the Assignee of the present application. These patent publications are incorporated by reference herein for all purposes. In general, a continuum robot includes a tubular body having one or more bendable sections which continuously bend in various directions to reach into confined spaces by shaping the tubular body into continuous smooth curves similar to a snake's movement. The one or more bendable sections are mechanically actuated by driving wires arranged along the length of the tubular body. The driving wires are actuated in push and pull directions by one or more actuators arranged in an actuator unit which is removably connected to the proximal end of the tubular body. In a continuum robot catheter, the tubular body is often designed to be single-use (disposable) or of limited use due to sterility requirements. Therefore, it is important that a user be able to quickly connect and disconnect the bendable body to/from the actuator unit. To improve connection, prior to use, the continuum robot catheter needs to be in a known state in order to calibrate the system. Specifically, the system needs to be calibrated ("zeroed out") in order for the system to calculate the driving wires movements needed to achieve the desired catheter bending.

Since the continuum robot catheter is likely to be very long (e.g., about 800 mm long or even longer), it is difficult for the user to hold the catheter packaging, remove the catheter carrier tube, and connect the catheter to the actuation handle of the robot system. Specifically, because the outer packaging (tray or box), the carrier tube, and the catheter have to be separated from each other before connecting the catheter to the actuator unit, it is difficult to find space in the operating table to set these components down during unpacking and setup. Therefore, there is a need for improved catheter packaging, in particular sterile packaging for continuum robot catheters that can facilitate easier connection of the continuum robot catheter to its actuating unit.

SUMMARY OF EXEMPLARY EMBODIMENTS

According to at least one embodiment of the present disclosure, there is provided a novel catheter packaging comprising a sterile packaging and an alignment tube configured to hold a steerable catheter arranged in a predetermined pose while presenting the catheter for connection with an actuator unit. More specifically, a sterile packaging assembly for removably storing an elongated steerable catheter comprises: a sterile package configure to hold the elongated steerable catheter in a predetermined posture; and an alignment tube configured to present one end of the elongated steerable catheter for connection with an actuator unit without changing the predetermined posture of the elongated catheter. The packaging assembly is designed such that the actuator unit can be connected to the elongated steerable catheter while the catheter device is still in the package.

A method of removably storing an elongated medical device in a sterile packaging assembly and connecting the elongated medical device to a non-sterile component, comprises: inserting the elongated medical device in an alignment tube such that the alignment tube constrains the elongated medical device to a predetermined posture; and enclosing the alignment tube together with the elongated medical device inserted therein within a sterile package, wherein the alignment tube is configured to present one end of the elongated medical device for connection with an actuator unit without changing the predetermined posture of the elongated medical device.

According to another embodiment, a workflow for packaging removal and calibration of a steerable catheter comprises: initializing an actuation handle by using system managing software. The software system sets acceptor parts of the actuator unit to a predetermined position (an initial position) for receiving the driving wires of the catheter without removing the catheter from the sterile packing. The initial position is programmed in advance based on the packaging design. Specifically, in one embodiment, the system is configured to first move the acceptor parts of the actuator unit to a position for receiving the driving wires when the catheter is in a predetermined shape. In one embodiment, the acceptor parts of the actuator unit can receive the steerable catheter constrained to a straight (linear) shape in the sterile packaging. In other embodiments, the system may be configured to receive the steerable catheter constrained to a curved (bent) shape in the sterile packaging, and move the acceptor parts for the driving wires to positions for the curved shape of the catheter.

Once, the system or the user confirms completion of the initialization step, the user proceeds to the following procedure for connecting the steerable catheter to actuation unit without removing the catheter from the sterile packaging. First, peel off a top web to open the sterile packaging; second, pull the catheter hub, the hub holder, and the alignment tube partially out of the packaging; third, unfold the hub holder, exposing the package slots; fourth: place the hub holder on the side of the sterile packaging; fifth: expose the control hub, and make the control hub ready for connection to the actuation handle. Note that throughout the process of first to fifth steps, the steerable catheter is kept clean within the alignment tube. Then, in a sixth step, the user places the catheter packaging near the patient (on the cart, table, or bet). In a seventh step, the user connects the actuation handle to the exposed hub and connect the driving wires in the catheter to the acceptor parts in the actuation handle.

Since the system has already positioned the acceptor parts for the desired shape (e.g., straight shape) in the initialization step, the user can assemble the catheter with the proper shape (in this embodiment, straight shape) with minimal risk to have an unexpected shape error by leveraging the package with straight constraint for the catheter.

Advantageously, there is no need to add an additional part or process for shape calibration by using the package for initial alignment. Therefore, it is possible to minimize the cost of the system, reduce the burden for the user to manage the number of parts for setting up, and expedite the calibration process.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

Further objects, features and advantages of the present disclosure will become apparent from the following detailed description when taken in conjunction with the accompanying figures showing illustrative embodiments of the present disclosure.

FIG. 2A, FIG. 2B, FIG. 2C and FIG. 2D illustrate details of a steerable catheter 100, according to one or more embodiments of the present disclosure;

FIG. 4 illustrates an exemplary workflow for a method of removably storing an elongated medical device in a sterile packaging assembly and connecting the elongated medical device to a non-sterile component, wherein the actuator unit can be connected to the elongated medical device while the device is still in the sterile packaging;

DETAILED DESCRIPTION OF EXEMPLARY EMBODIMENTS

Figure 1:
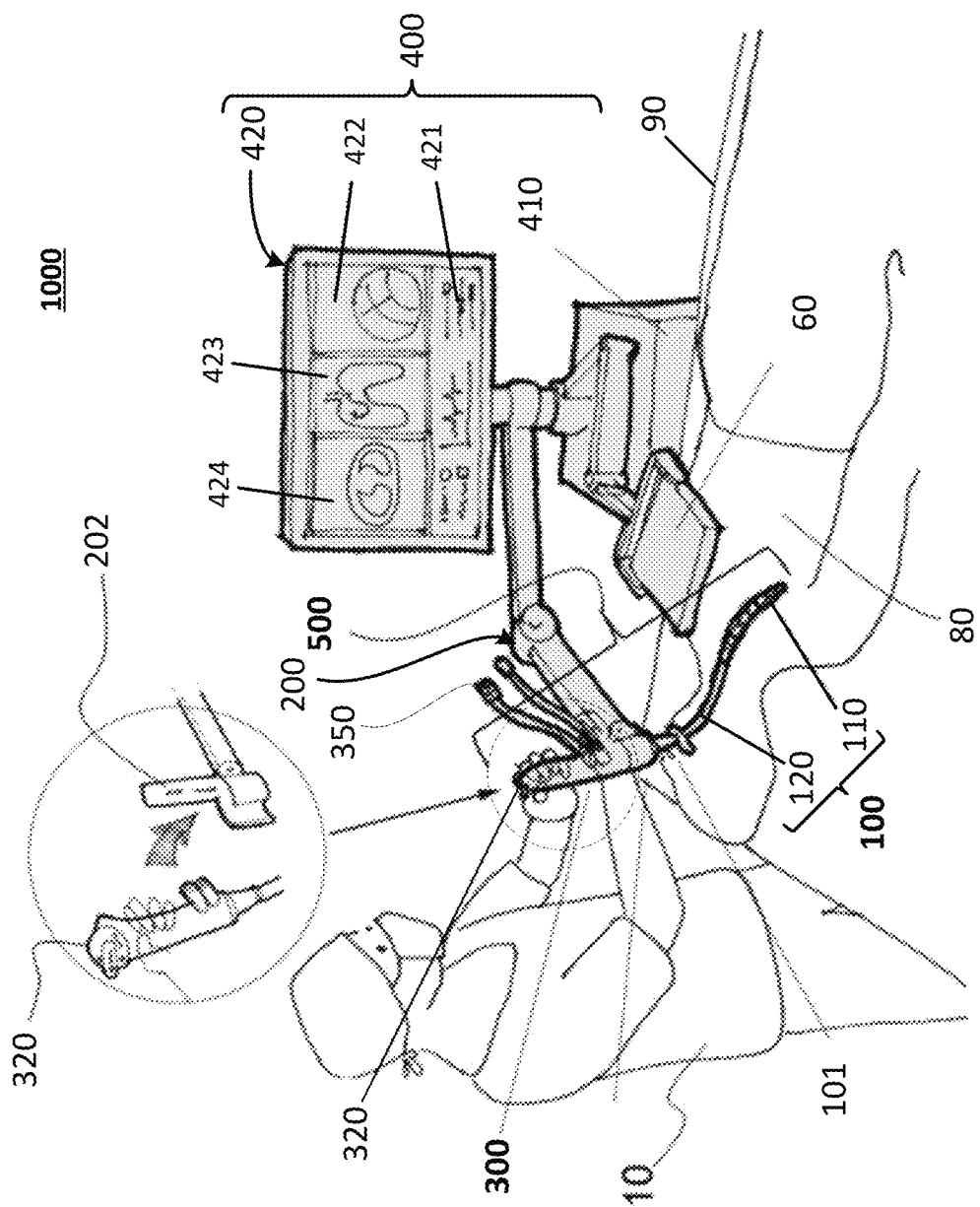
FIG. 1 illustrates the general structure of a medical system woo comprising a continuum robot 500 for use in a medical environment such as an operating room (OR)

Before the various embodiments are described in further detail, it shall be understood that the present disclosure is not limited to any particular embodiment. It is also to be understood that the terminology used herein is for the purpose of describing exemplary embodiments only, and is not intended to be limiting. Embodiments of the present disclosure may have many applications within the field of medical treatment or minimally invasive surgery (MIS).

Throughout the figures, the same reference numerals and characters, unless otherwise stated, are used to denote like features, elements, components or portions of the illustrated embodiments. In addition, while the subject disclosure is described in detail with reference to the enclosed figures, it is done so in connection with illustrative exemplary embodiments. It is intended that changes and modifications can be made to the described exemplary embodiments without departing from the true scope of the subject disclosure as defined by the appended claims. Although the drawings represent some possible configurations and approaches, the drawings are not necessarily to scale and certain features may be exaggerated, removed, or partially sectioned to better illustrate and explain certain aspects of the present disclosure. The descriptions set forth herein are not intended to be exhaustive or otherwise limit or restrict the claims to the precise forms and configurations shown in the drawings and disclosed in the following detailed description.

Those skilled in the art will recognize that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two components" without other modifiers, means at least two components, or two or more components). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be understood to include the possibilities of "A" or "B" or "A and B", unless specifically recited "only A or only B".

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached", "coupled" or the like to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown in one embodiment can apply to other embodiments. It will also be appreciated by those of skill in the art that references to a structure or feature that is disposed "adjacent" to another feature may have portions that overlap or underlie the adjacent feature.

The terms first, second, third, etc. may be used herein to describe various elements, components, regions, parts and/ or sections. It should be understood that these elements, components, regions, parts and/or sections are not limited by these terms of designation. These terms of designation have been used only to distinguish one element, component, region, part, or section from another region, part, or section. Thus, a first element, component, region, part, or section discussed below could be termed a second element, component, region, part, or section merely for purposes of distinction but without limitation and without departing from structural or functional meaning.

As used herein, the singular forms "a", "an", and "the" are intended to include the plural forms as well, unless the context clearly indicates otherwise. It should be further understood that the terms "includes" and/or "including", "comprises" and/or "comprising", "consists" and/or "consisting" when used in the present specification and claims, specify the presence of stated features, integers, steps, operations, elements, and/or components, but do not preclude the presence or addition of one or more other features, integers, steps, operations, elements, components, and/or groups thereof not explicitly stated. Further, in the present disclosure, the transitional phrase "consisting of" excludes any element, step, or component not specified in the claim. It is further noted that some claims or some features of a claim may be drafted to exclude any optional element; such claims may use exclusive terminology as "solely," "only" and the like in connection with the recitation of claim elements, or it may use of a "negative" limitation.

The term "about" or "approximately" as used herein means, for example, within 10%, within 5%, or less. In some embodiments, the term "about" may mean within measurement error. In this regard, where described or claimed, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range, if recited herein, is intended to be inclusive of end values and includes all sub-ranges subsumed therein, unless specifically stated otherwise. As used herein, the term "substantially" is meant to allow for deviations from the descriptor that do not negatively affect the intended purpose. For example, deviations that are from limitations in measurements, differences within manufacture tolerance, or variations of less than 5% can be considered within the scope of "substantially" the same. The specified descriptor can be an absolute value (e.g. substantially spherical, substantially perpendicular, substantially concentric, etc.) or a relative term (e.g. substantially similar, substantially the same, etc.).

Unless specifically stated otherwise, as apparent from the following disclosure, it is understood that, throughout the disclosure, discussions using terms such as "processing," "computing," "calculating," "determining," "displaying," or the like, refer to the action and processes of a computer system, or similar electronic computing device, or data processing device that manipulates and transforms data represented as physical (electronic) quantities within the computer system's registers and memories into other data similarly represented as physical quantities within the computer system memories or registers or other such information storage, transmission or display devices. Computer or electronic operations described in the specification or recited in the appended claims may generally be performed in any order, unless context dictates otherwise. Also, although various operational flow diagrams are presented in a sequence(s), it should be understood that the various operations may be performed in other orders than those which are illustrated or claimed, or operations may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "in response to", "related to," "based on", or other like past-tense adjectives are generally not intended to exclude such variants, unless context dictates otherwise.

The present disclosure generally relates to medical devices, and it exemplifies embodiments of an optical probe which may be applicable to a spectroscopic apparatus (e.g., an endoscope), an optical coherence tomographic (OCT) apparatus, or a combination of such apparatuses (e.g., a multi-modality optical probe). The embodiments of the optical probe and portions thereof are described in terms of their state in a three-dimensional space. As used herein, the term "position" refers to the location of an object or a portion of an object in a three-dimensional space (e.g., three degrees of translational freedom along Cartesian X, Y, Z coordinates); the term "orientation" refers to the rotational placement of an object or a portion of an object (three degrees of rotational freedom—e.g., roll, pitch, and yaw); the term "posture" refers to the position of an object or a portion of an object in at least one degree of translational freedom and to the orientation of that object or portion of object in at least one degree of rotational freedom (up to six total degrees of freedom); the term "shape" refers to a set of posture, positions, and/or orientations measured along the elongated body of the object.

As it is known in the field of medical devices, the terms "proximal" and "distal" are used with reference to the manipulation of an end of an instrument extending from the user to a surgical or diagnostic site. In this regard, the term "proximal" refers to the portion (e.g., a handle) of the instrument closer to the user, and the term "distal" refers to the portion (tip) of the instrument further away from the user and closer to a surgical or diagnostic site. It will be further appreciated that, for convenience and clarity, spatial terms such as "vertical", "horizontal", "up", and "down" may be used herein with respect to the drawings. However, surgical instruments are used in many orientations and positions, and these terms are not intended to be limiting and/or absolute.

As used herein the term "catheter" generally refers to a flexible and tubular instrument made of medical grade material designed to be inserted through a narrow opening into a bodily lumen (e.g., a vessel or the trachea or intestine, etc.) to perform a broad range of medical functions. The more specific term "optical catheter" refers to a medical instrument comprising an elongated bundle of one or more flexible light conducting fibers disposed inside a protective sheath made of medical grade material and having an optical imaging function. A particular example of an optical catheter is fiber optic catheter which comprises a sheath, a coil, a protector and an optical probe. In some applications a catheter may include a "guide catheter" which functions similarly to a sheath.

As used herein the term "endoscope" refers to a rigid or flexible medical instrument which uses light guided by an optical probe to look inside a body cavity or organ. A medical procedure, in which an endoscope is inserted through a natural opening, is called an endoscopy. Specialized endoscopes are generally named for how or where the endoscope is intended to be used, such as the bronchoscope (mouth), sigmoidoscope (rectum), cystoscope (bladder), nephroscope (kidney), bronchoscope (bronchi), laryngoscope (larynx), otoscope (ear), arthroscope (joint), laparoscope (abdomen), and gastrointestinal endoscopes.

In the present disclosure, the terms "optical fiber", "fiber optic", or simply "fiber" refers to an elongated, flexible, light conducting conduit capable of conducting light from one end to another end due to the effect known as total internal reflection. The terms "light guiding component" or "waveguide" may also refer to, or may have the functionality of, an optical fiber. The term "fiber" may refer to one or more light conducting fibers. An optical fiber has a generally transparent, homogenous core, through which the light is guided, and the core is surrounded by a homogenous cladding. The refraction index of the core is larger than the refraction index of the cladding. Depending on design choice some fibers can have multiple claddings surrounding the core.

Embodiments of the present disclosure are directed to improving sterility and calibration of robotically controllable endoscopes or catheters applicable to minimally invasive surgical (MIS) procedures. MIS procedures involve the use of long rigid or flexible surgical instruments that are inserted into a biological lumen of a patient through small incisions or natural orifices. Since there is a wide range of well-known endoscopic procedures, the present disclosure is not limited to any specific procedure, but it can be particularly applicable to MIS procedures where the distal section of an endoscope is inserted in a biological lumen and is actively steered to a desired location a robotic actuator located at the proximal end of the endoscope. Throughout this disclosure, working principles and novel improvements for robotic controlled endoscopic devices are described in detail. The application of such endoscopic devices includes procedures for both diagnostic and therapeutic purposes.

First, structural components of a medical system moo comprising a continuum robot 500, a support platform 200, and a computer system 400 will be described with reference to FIG. 1 and FIGS. 2A-2C. The continuum robot 500 is configured to form a continuously curved geometry by actuating at least a portion of a steerable catheter 100. An example of a continuum robot 500 is a snake-like endoscopic device, as described in applicant's previously published U.S. Pat. Nos. 9,144,370, 11,051,892, and patent application publications US 2015/0088161, US 2018/0243900, US 2018/0311006 and US 2019/0015978, which are incorporated by reference herein for all purposes.

Continuum Robot System

FIG. 1 illustrates the general structure of a medical system 1000 comprising a continuum robot 500 for use in a medical environment such as an operating room (OR) to treat a patient 80. The medical system 1000 is comprised of the continuum robot 500, the computer system 400, and the support platform 200. The computer system 400 includes a display screen 420 and a console 410. The continuum robot 500 is removably mounted on the support platform 200, and remains in data communication with the computer system 400 via wired and/or wireless connections (not shown). The support platform 200 may include one or more than one articulation arm, and a linear stage 202 onto which an actuation handle is mounted. The continuum robot 500 includes a steerable catheter 100 and an actuation handle which is referred herein as an actuator unit 300. The steerable catheter 100 is connected to the actuator unit 300 via a catheter connector 101. The steerable catheter 100 has a proximal section 120 and a distal section 110. The distal section no is configured to be inserted into a biological lumen (e.g., the trachea) of the patient 80, and the proximal section 120 of the steerable catheter 100 is configured to be connected to the actuator unit 300 via the connector 101.

The actuator unit 300 may include a microcontroller and one or more actuators (not shown) enclosed in a housing generally shaped as a catheter handle. The catheter handle is configured to be gripped by one or both hands of a user 10. The microcontroller in the actuator unit 300 may include a proportional-integral-derivative (PID) controller or other digital signal processor (DSP) along with suitable software, firmware and peripheral hardware, which are known to persons having ordinary skill in the art. The one or more actuators may include one or more motors configured to actuate (move) the one or more control wires used to bend one or more segments of the distal section 110. The actuator unit 300 may include a user control unit 320 such as a joystick and/or gamepad; the user control unit 320 can be configured to selectively bend the distal section no with a continuous curvature in various directions. The housing of actuator unit 300 may also include or be connected to one or more access ports 350. Access ports 350 can be used to pass tools or fluids through a tool channel of the steerable catheter loft In some embodiments, the one or more access ports 152 may be included in the connector 101 of the catheter 100 (as shown in FIG. 2A).

The computer system 400 can provide the user 10 (e.g., a surgeon or endoscopist) with a graphical user interface (GUI) in the display device 420 through which the user 10 can interact and control the entire system. During an initial calibration procedure, the system processor or central processing unit (CPU) of computer system 400 may be configured to perform operations for setting an initial state of the actuator handle based on computer-executable code pre-stored in the system's memory (not shown). More specifically, the user 10 can initialize the actuation handle by using the system's software to set acceptor parts of the actuator unit 300 to an initial position for receiving the driving wires of the catheter 100 while the catheter is presented in a predetermined shape. The initial position of the acceptor parts for receiving the driving wires can be programmed in advance based on the catheter packaging design (e.g., based on the shape of the alignment tube 130).

During a medical procedure, the display device 420 may be configured to display one or more of system settings and patient information 421, a live image 422, an intra-operative guidance image 423, and a pre-operative image 424 (e.g., a slice scan image) of the patient 80. The intra-operative guidance image 423 may be based, at least in part, in the shape or position of the steerable catheter 100 imaged with an electromagnetic (EM) field generator 60. In some embodiments, the user 10 may use the GUI provided by the display device 420 to interact and remotely operate or confirm appropriate calibration of the steerable catheter 100.

Steerable Catheter

FIG. 2A, FIG. 2B, FIG. 2C and FIG. 2D illustrate additional details of the steerable catheter 100, according to one or more embodiments of the present disclosure. FIG. 2A shows the catheter 100 including an elongated tubular body attached to the connector 101. The elongated tubular body comprises a distal section 110 and a proximal section 120. The distal section 110 is configured to be inserted into a bodily lumen (e.g., an airway leading to the lungs) of a patient. The proximal section 120 is configured to be connected to an external actuator unit 300 via the connector 101. At least one tool channel 150 traverses the catheter 100 through the center of the connector 101 and through the center of the proximal section 120 and distal section 110. A plurality of driving wires 210 are attached to one or more bendable segments of the steerable catheter, travel through a wall of the steerable catheter and through the connector 101, and protrude through the proximal section 120 towards the connector 101. The connector 101 includes a connector hub 102 and an access port 152. The access port 152 can be used to insert tools or to pass fluids. The connector hub 102 holds a plurality of connecting rods 103 organized in a predetermined manner (e.g., symmetrically distributed around a longitudinal axis of the catheter). The connector hub 102 holds a plurality of connecting rods 103 (proximal ends of the driving wires) configured to engage with acceptor parts 302 arranged inside the housing (actuation handle) of actuator unit 300.

Figure 3A:
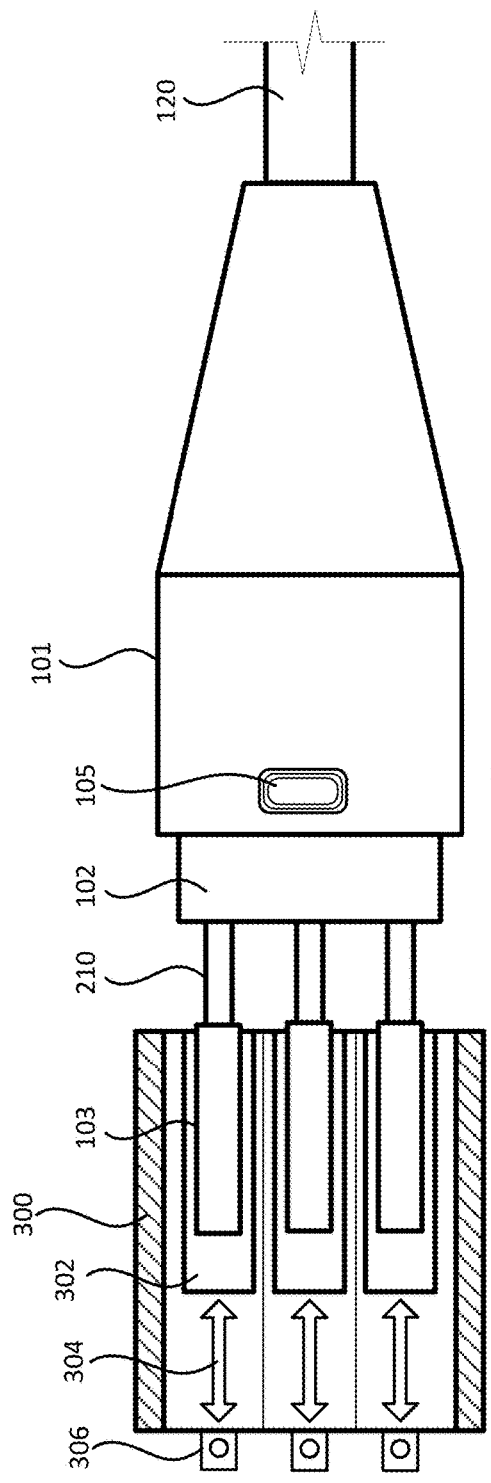
FIG. 3A shows an initialization process of an actuator unit 300 configured to move acceptor parts thereof to a position for receiving driving wires of the steerable catheter 100 having a predetermined straight shape.
Figure 3B:
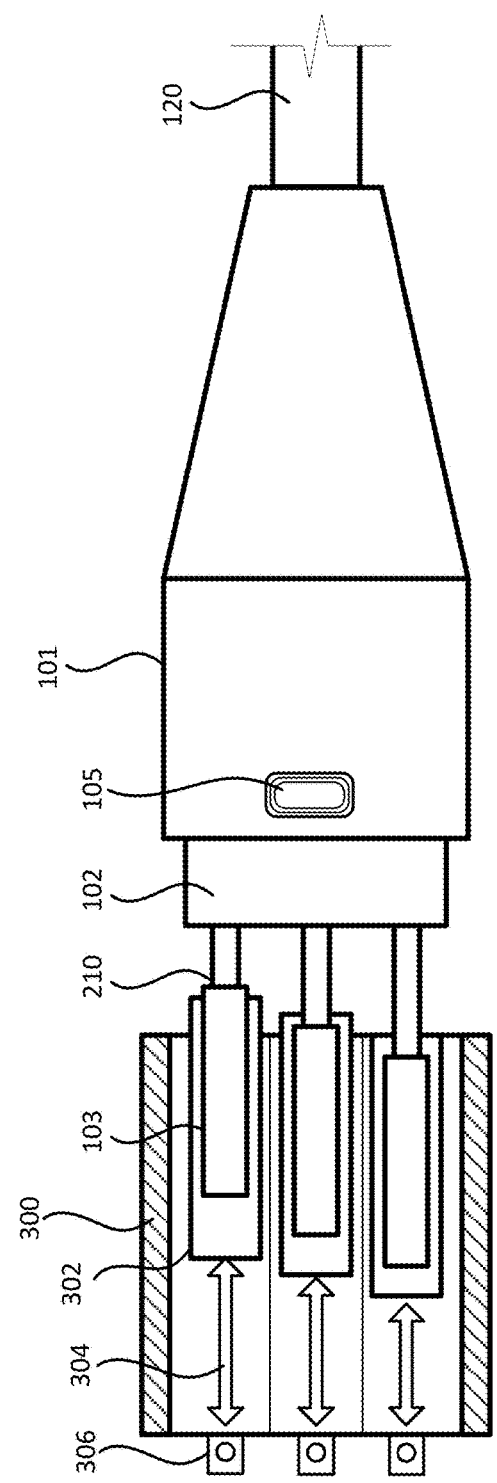
FIG. 3B shows an initialization process of an actuator unit 300 configured to move acceptor parts thereof to a position for receiving driving wires of the steerable catheter 100 having a predetermined curbed or bent shape.

FIG. 2B illustrates an embodiment of steerable catheter 100 without the connector 101. The elongated tubular body of steerable catheter 100 is formed of a rigid tubular part referred to as the proximal section 120 and a plurality of rings referred to as the distal section 110. The distal section 110 includes one or more bending segments configured to be actuated by the driving wires 210. FIG. 2B illustrates an embodiment of steerable catheter 100 having a distal section 110 comprised of a first bending segment 111 and a second bending segment 113. Depending on the desired application of the steerable catheter 100 the distal section 110 can include more than two bending segments. Each bending segment includes a plurality of rings arranged at a predetermined distance from each other in the lengthwise direction of the catheter. The inner diameter of each of the rings is aligned with the inner diameter of the rigid tubular part to form the tool channel 150. In FIG. 2B, the first bending segment 111 includes rings 111A, 111B, etc., and the second bending segment 113 includes rings 113A, 113B, etc. An anchor member 114 is arranged between the first bending segment in and the second bending segment 113. The second bending segment 113 is arranged distal to the proximal section 120. In some embodiments, one or more additional bending segments (not shown) can be arranged between the distal segment 111 and the proximal segment 113. The rigid tubular part of the proximal section 120 and each of the rings arranged in the distal section no include one or more conduits or thru-holes along the wall of the catheter; these conduits or thru-holes are configured to pass therethrough driving wires 210. In the catheter 100 shown in FIG. 2B, distal ends of one or more driving wires 210 are anchored at the most distal ring 111A, and distal ends of other driving wires 210 are anchored at the anchor member 114. The driving wires are arranged along the wall of the steerable catheter, such that proximal ends of the driving wires protrude through the proximal end of the driving wires. The proximal ends of driving wires 210 pass through the connector 101, and are terminated by a plurality of connecting rods 103 held by the connector hub 102 (as shown in FIG. 2A, FIG. 3A and FIG. 3B). It will be appreciated that distal ends of the driving wires 210 receive an actuation force (either a pushing or pulling force) from the actuator unit 300.

FIG. 2C shows another embodiment of catheter 100 including a proximal section 120 and a distal section 110. FIG. 2C shows the proximal section 120 includes a cylindrical tubular body, which includes at least one tool channel 150. The tool channel 150 extends along (inside) the cylindrical opening of the tubular body. The distal section 110 shown in FIG. 2C includes a single bending segment comprised of a plurality of rings 112A, 112B, etc. In this case, driving wires 210 are anchored only at the most distal ring 112A. The rings of each bending segment and the anchor members are wire-guiding members which have small thru-holes 104 parallel to the tool channel 150. The thru-holes 104 serve as conduits to pass therethrough the driving wires 210 or other electronic components. The rings of each bending segment, the tubular body of proximal section 120 and anchor member 114 can be made of conventional biocompatible materials such as polyether block amide (e.g., Pebax®) or plastics such as polyurethane and the like. An outer sheath and/or inner sheath made of similar biocompatible material and coated with medical grade lubricious material can be arranged on one or both of the outer surface and inner surface of the rings to cover the distal section 110 and/or the proximal section 120 of catheter 100. The sheath can be made of biocompatible Pebax or other composites or plastics such as polyurethane.

FIG. 2D shows an exemplary ring 112 having a first thru-hole 104a, a second thru-hole 104b and a third thru-hole 104c. In ring 112, the thru-holes 104a, 104b, 104c are formed in the ring wall between the inner surface and outer surface of the ring. Rings of other segments can have a different number of thru-holes or no thru-holes at all. The thru-holes 104 can be used to pass driving wires 210 which are actuated by actuators of the actuator unit 300. At least some of the thru-holes 104 can also be used to pass backbone wires which are not actuated. The thru-holes 104 can further be used to hold therein electronic components such as miniaturized electromagnetic (EM) sensors, or can be filled with radiopaque material. EM sensor and/or radiopaque material can be useful for image guided intraoperative procedures.

The tool channel 150 may be configured to pass therethrough an imaging device (not shown), or to allow passage of end effector tools to be delivered to and operated at the distal end of the catheter. In addition, tool channel 150 may also be used for sending and/or retrieving fluids in liquid or gaseous state (e.g., gas, saline, water, etc.) to/from a target area inside the body of a patient. The imaging device may include an endoscope camera, or a fiber-based imaging probe. An example of an endoscope camera includes, but is not limited to, a chip-on-tip (COT) camera, such as a camera with a miniature CMOS sensor arranged at the tip of the imaging device.

The steerable catheter 100 is configured to provide flexible access for an array of instruments allowing remote imaging, manipulation, cutting, suturing, delivery and retrieval of liquid or gaseous substances, etc., to/from intraluminal target areas inside a patient's anatomy. To that end, the steerable catheter 100 must provide flexibility for navigating through tortuous paths, while retaining torsional and longitudinal rigidity so that the user can control the instruments located at the distal end of the catheter, by remotely operating such instruments via the user's control unit 320 (joystick) or the computer system 400. In operation, one or more of the bending segments of the steerable catheter wo is actuated by pushing or pulling forces applied to each of the driving wires 210. FIG. 2B shows an example where the steerable catheter 100 is in a relaxed mode (not bent) so that proximal ends of all driving wires 210 are substantially at a same plane. Here, the steerable catheter 100 is in a straight or linear pose. FIG. 2C shows an example where the steerable catheter 100 is in a bent or actuated mode so that proximal ends of one or more driving wires 210 are at different plane (i.e., offset from each other in a lengthwise direction). Here, the steerable catheter 100 is in a bent or curved pose.

Robotic Catheter Setup Workflow

From the forgoing description of the continuum robot 500, it will be appreciated by those of ordinary skill in the art that steerable catheter 100 is a delicate instrument that needs precise alignment and calibration during its initial connection to the actuator unit 300. Precise alignment and calibration during initial connection of the catheter is necessary in order to achieve accurate catheter operation and to ensure patient safety. Particularly, as noted above, the continuum robot 500 needs the catheter 100 to be in a known state in order to calibrate the system—the system needs to be "zeroed out" in order for the system to calculate the wire movements needed to achieve desired catheter bending. To facilitate safe and rapid connection of the steerable catheter 100 to the actuator unit 300, the applicant's previous patent application publication US 2021/0121051 discloses a connector with acceptor parts configured to receive a plurality of connecting rods attached to driving wires of a catheter. In the previous publication the acceptor parts are configured to receive L-shaped connecting rods in a slide and twist maneuver. In addition, non-published patent application Ser. No. 17/133,184 discloses a magnetic connector where acceptor parts are configured to receive linear (straight) magnetized connecting rods attached to driving wires of a catheter. In previous patent application Ser. No. 17/133,184, the magnetized connecting rods on the catheter side are inserted into an actuation handle and engaged by magnetic force with acceptor parts of the actuator unit; then, a locking feature secures the mechanical connection between the actuator unit and the catheter. Publication US 2021/0121051 and patent application Ser. No. 17/133,184, which are both disclosed by the Assignee of the present application, are incorporated by reference herein for all purposes.

In the present application, the inventors have recognized the need to have not only the acceptor parts on the actuator side, but also the driving wires on the catheter side in a predetermined posture to further improve safe and rapid connection of the steerable catheter 100 to the actuator unit 300. To that end, the present application discloses a novel packaging assembly comprised of a sterile enclosure (sterile package) and an alignment tube configured to enclose the steerable catheter 100 in a predetermined pose. In this manner, at the time of connecting the steerable catheter to the actuator unit of robotic system, the sterile package and alignment tube are used to present the connecting rods 103 pre-arranged for connection with the actuator unit 300. Advantageously, when proximal ends of driving wires 210 (connecting rods 103) are pre-arranged according to the predetermined shape of the steerable catheter, connection between the actuator unit 300 and the catheter connector 101 can be accomplished quickly and without removing the catheter from the sterile package. According to a first embodiment, the novel packing assembly is described according to an exemplary workflow for connecting a new steerable catheter 100 to the actuator unit 300 of the robotic system.

FIG. 4 illustrates an exemplary workflow for connecting a new catheter 100 to the actuator unit 300. As mentioned above, prior to initiating use of a catheter in a patient, it is important to perform an initial calibration of the catheter to ensure appropriate functionality. Therefore, when the user 10 is about to perform a given procedure, the user first initializes the actuator unit 300 (i.e., the actuation handle) by using the system's software. The software causes the controller system to set the acceptor parts of the actuator unit 300 to a calibrated position (an initial position) for receiving the driving wires of the catheter without removing the catheter from the catheter packaging. The calibrated or initial position of the acceptor parts 302 can be programmed in advance based on the catheter design. The catheter design can be known a priori depending on one or more of the type or size of catheter, the specific medical procedure to be performed, the applicable patient, etc. For example, for an endonasal procedure, at least part of the catheter can be in an already curved (bent) shape, while for an endotracheal procedure, the catheter can be in a linear (straight) shape. In another example, for a catheterization procedure, at least part of the catheter could be bent in a pre-curved shape to access the ventricle (e.g., in the case of ventricle catheters). In a further example, for robotic-assisted bronchoscopy of pulmonary nodules, an ultra-thin endoscope with a pre-curved tip may be used.

FIG. 3A and FIG. 3B show examples of an initialization step of the actuator unit 300 to receive the steerable catheter 100 according to a predetermined shape of the steerable catheter. As noted above, the steerable catheter may adopt a predetermined shape due to the need to constrain a long catheter to a coiled shape to reduce the size of the packaging, or due to the design of the catheter. FIG. 3A shows a connection of the catheter connector 101 to actuator unit 300 when the catheter 100 is in a predetermined straight shape or pose. FIG. 3A shows a cross sectional view of an actuator unit 300 having a plurality of acceptor parts 302, according to an exemplary embodiment. Acceptor parts 302 can be linear stages powered and controlled through connection terminals 306. For example, in one embodiment, acceptor parts 302 can include an ultrasonic linear actuator for each driving wire 210. The linear actuator functions as a linear stage configured to move linearly in a lengthwise direction 304 based on piezoelectric principles. The acceptor parts 302 are arranged inside the housing of an actuator handle of the actuator unit 300. Each acceptor part 302 can be controlled independently to receive a connecting rod 103 which in turn is attached to a driving wire 210. The system can control each acceptor part 302 individually to move in the lengthwise direction 304 (bidirectional) to the initial position for connection with the connecting rods 103. When a connecting rod 103 is engaged with an acceptor part 302, the actuator unit 300 controls the acceptor part 302 to mechanically transmit movement (or a driving force) to a driving wire 210.

Figure 6:
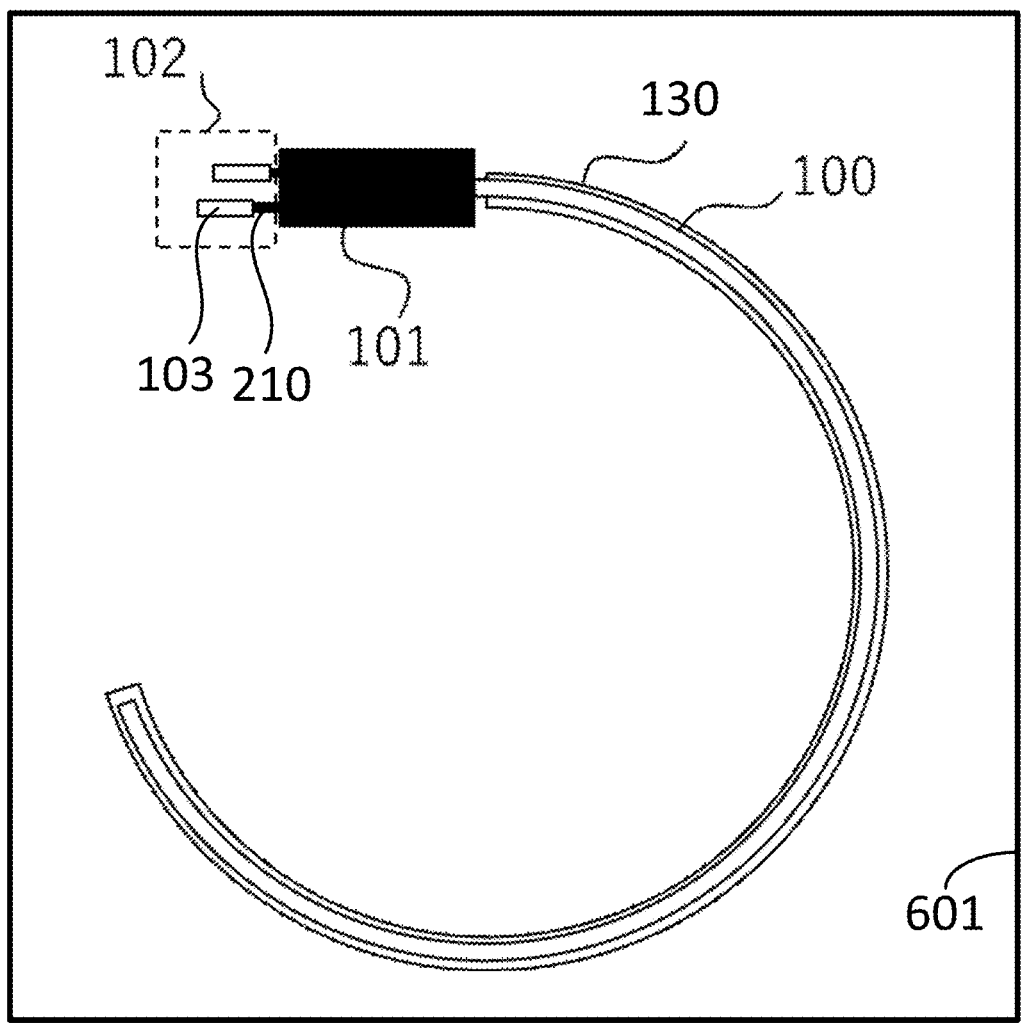
FIG. 6 illustrates another embodiment of the alignment tube 130 configured to constrain the shape of the steerable catheter 100 to a non-linear posture.

During an initialization process, according to one embodiment, the system software can be programmed to set the acceptor palls 302 of the actuator unit 300 to an initial position according to the expected packaging design of the catheter. For example, in some embodiments as illustrated in FIG. 3A, the system can expect that the catheter 100 is constrained to a straight shape in the manufacturer's packing. In this case, the system can move the acceptor pails 302 to the position for receiving the connecting rods 103 of driving wires 210 in the straight shape of the catheter. As it can be appreciated from FIG. 2B, when the catheter is in a linear (straight) shape, the proximal ends of all driving wires 210 are substantially at the same plane. In contrast, as seen from FIG. 2C and FIG. 6, when the catheter is in a curved (bent) shape, the proximal ends of the driving wires 210 are not at the same plane (some wires are more proximally displaced than others). Therefore, it is necessary to place the acceptor parts 302 of the actuator unit 300 to the initial position where the connecting rods 103 will be arranged according to the predetermined pose or shape in which the catheter is stored in the sterile packaging. FIG. 3B shows an example where the acceptor parts 302 independently move to different planes to facilitate engagement with the connecting rods 103 when the catheter 100 is in a predetermined bent or curved shape (e.g., as shown in FIG. 2C and FIG. 6).

Therefore, the system first initializes the actuation handle by using the system's software to set the acceptor pails 302 for the driving wires in the catheter to the initial position. The position of the acceptor parts 302 can be programmed in advance based on the package design, or the user can be prompted by the system to enter the type of package design to carry out the initialization step. Specifically, the system can be configured to expect the catheter to be constrained to a straight or curved shape in the package, and move the acceptor parts 302 for the driving wires 210 to the position for the shape of the catheter. For example, if the packaging assembly constrains the catheter to a curved shape as shown in FIG. 6, the connecting rods 103 will be displaced from each other in a lengthwise direction. Accordingly, the system's software will set the acceptor parts 302 to an initial position corresponding to the driving wires in the catheter. Once the user confirms completion of the initialization step, the user proceeds with the workflow of FIG. 4.

Referring back to FIG. 4, prior to a procedure, the user is provided with a new catheter 100 enclosed in a sterile packaging assembly 600. Packaging assembly 600 is designed such that the actuator unit (actuation handle) can be connected to the driving wires 210 which catheter 100 is still in the package constrained to its packaged pose.

The packaging assembly 600 includes the steerable catheter 100 arranged in a package 601 (a packaging enclosure) which is hermetically sealed by a sterile top web 602. An alignment tube 130 (a shape-constraining member), defining a lumen configured to receive and pass therethrough at least part of the steerable catheter 100, is provided inside the package 601. The package 601 can be a substantially rectangular container (a box-like structure) that serves as a protective housing for the steerable catheter 100. In one embodiment, the package 601 is a box or a tray that has a bottom surface and a raised edge connected to and surrounding the bottom surface; and the top web 602 is thin lid arranged on the raised edge opposite to the bottom surface. In other embodiments, package 601 includes a mounting card onto which the steerable catheter 100 and alignment tube 130 are attached. In this regard, the package 601 can be similar to well-known sterile packing used for conventional elongated catheters or endoscopes. For example, a heat-sealable, sterilizable package having a lid that can be peeled open is well-known. This type of packages for medical devices where it is desirable to peel open the lid to gain access to the non-invasive portion of a medical device for preparatory tasks, such as calibration or the like, without contaminating the invasive portion of the device, is known from one or more the publications listed in the Background section of this disclosure.

Advantageously, in the present disclosure, to facilitate easier connection of the driving wires that protrude from the proximal end of the steerable catheter, the alignment tube is configured to releasably engage with at least part of the steerable catheter, and maintain the at least part of the steerable catheter constrained to a predetermined shape. In one embodiment, the alignment tube 130 is an elongated carrier tube which constrains at least part of the steerable catheter 100 to a predetermined shape of the tube. In other embodiments, the alignment tube 130 can be replaced by any other structure, configured to releasably engage with at least part of the steerable catheter, and maintain the at least part of the steerable catheter constrained to a predetermined shape. For example, the alignment tube can be replaced by a series of retainers, such as clips fixedly attached to the package 601. The clips may be formed via molding, casting, 3D printing, or other suitable process. In this case, the clips can have a surface (e.g., a c-shaped or u-shaped surface) configured to engage with the wall of the catheter at discrete locations for restricting movement and constraining the catheter to the desired shape.

A hub holder 604 (a securing member) can be included inside the package 601 or can be attached to the package 601. The hub holder 604 can be pre-assembled with the alignment tube 130, or can be provided inside the tray or package 601 to be assembled with the alignment tube 130 by the user. The hub holder 604, attached or attachable to the raised edge of the tray, holds the proximal section 110 of the steerable catheter wo raised to the edge of the tray or package 601, so that the connector hub 102 can be presented for connection of the driving wires with the actuation handle.

The package 601, the alignment tube 130, and the top web 602 can be manufactured in variety of configurations, and can be made of commercially available biocompatible and sterilizable materials. For example, the top web 602 can be a thin lid made of typical packaging materials, such as Tyvek® or equivalents thereof. The top web 602 can be made of extruded Mylar® or any other material used to maintain sterility and compatible with ETO (Ethylene Oxide) sterilization. The package 601 can be a vacuum formed styrene structure to maintain sterility and to keep cost to a minimum. In other embodiments, the package 601 can be made in the shape of a flat tray with raised edges, where the hub holder 604 can be built-in or pre-attached to the raised edges of the tray. The package 601 can be replaced by a mounting card on which the catheter and the alignment tube are placed, and a cover sheet of heath-shrinkable material can be used for covering the mounting card, the catheter and alignment tube to restrict movement and constrain the catheter to a desired shape.

The alignment tube 130 may be formed in a suitable manner. For example, alignment tube 130 may be formed of any desired material via an extrusion process. Alternatively, the alignment tube may be formed via molding, casting, or other suitable process. To maintain the cost of packaging to a minimum, conventional polymer materials can be used to form the alignment tube 130 or any alternate structure thereof. In alternate embodiments, to more securely constrain the steerable catheter wo to a desired shape, the alignment 130 or any alternate structure thereof can even be made of well-known biocompatible metals, metal alloys, polymer-metal composites, or the like.

The package 601 and hub holder 604 require sufficient stiffness to hold the alignment tube 130 and the catheter 1000 in a predetermined shape even when the assembly package is moved for transportation, storage, etc. There are no limitations as to the specific shape or dimensions of the package 601, as long as the package 601 can enclose the steerable catheter wo engaged with the alignment tube 130 such that the predetermined shape of at least part of the catheter can be maintained unchanged until connection with the actuation handle. An inexpensive plastic material such as polypropylene can be used for the hub holder 604. In some embodiments, sterile cardboard or sterile plastic covered cardboard might also be used for the hub holder 604. In the case of cardboard, a decision to use such material should factor in the amount of particulate generated by the cardboard. The alignment tube 130 can also be made of inexpensive plastic such as polypropylene, which could be a likely solution. Cardboard material or plastic covered material is also an option for the alignment tube 130, as long as sterilization if maximized and particulate is minimized. In alternate embodiments, the alignment tube 130 can be implemented by alternate structures such as a rectangular compartment or channel formed on the surface of the package 601 or tray. In general, as it will be understood by those skilled in the art, for all components of the package 601, it is required a minimum amount of stiffness sufficient to hold the alignment tube 130 and the steerable catheter 100 constrained to its predetermined shape, the ability to maintain sterility of the enclosed device, and minimal particulate generation during alignment and connection of the catheter with the actuator unit.

To be used in an interventional procedure, the packaging assembly 600 can be placed on a clean surface such as an operating table, the patient's bed, or the system's console 400. Then, the user follows a procedure outlined in steps S402 through S412 shown in FIG. 4. At step S402, the user removes at least partially (e.g., peels off) the top web 602 to open the package 601 and expose at least a part of the steerable catheter 100. For example, to maintain sterility of the steerable catheter 100, only the proximal section of the catheter can be partially exposed without removing the catheter from the package 601.

At step S404, the user pulls or lifts the connector 101 together with the alignment tube 130 partially out of the package 601. The user unfolds the hub holder 604, and arranges the hub holder 604 across the package 601 with alignment tube 130 resting on the hub holder 604, such that the connector hub 102 slightly protrudes beyond the edge of package 601. At this point, at least part of the catheter 100 is still enclosed inside the alignment tube 130, and the connector hub 102 presents the proximal ends of the driving wires 210 preconfigured and ready for connection to the actuator unit 300 (actuation handle). It must be appreciated that since at least part of the catheter 100 remains inside the alignment tube 130, and the catheter and alignment tube are inside the package 601, the catheter 100 is kept clean and without being bent or pressed or exposed to the environment. In some embodiments, the hub holder 604 can be already pre-assembled with the package 601 and the alignment tube 130. In this case, step S404 may not be necessary. More specifically, it will be appreciated by persons skilled in the art that hub holder 604 is an optional component of the packaging assembly, as it is evident that the connector hub 102 can be presented for connection with the actuation handle without the hub holder 604. For example, the user may remove the top web 602 and manually lift the connector 101. Alternatively, the side of the package 601 can be manually removed to expose the connector hub 102.

At Step S406, if the package 601 is not on or near the console 400, the user places the package 601 and all its contents on or near the console 400. For example, the user places the packaging assembly 600 on the top surface of the console 400. Alternatively, the user places the packaging assembly 600 on the top surface of an operating table or patient's bed 90.

Next, at step S408, the user connects the actuation handle to the exposed connector hub 102, as well as connects the driving wires of the catheter to the acceptor parts in the actuation handle. More specifically, at step S408, the user brings the actuator unit 300 towards the exposed connector hub 102, and connects the actuator unit 300 with the catheter connector 101 without removing the catheter wo from the alignment tube 130 and without removing the alignment tube 130 from the package 601.

At step S410, after the actuator unit 300 is mechanically connected with the catheter 100, the computer system 400 runs a software routine to actively engage and lock the acceptor parts 302 with the connecting rods 103. At this point, the continuum robot 500 is assembled. When the user control unit 320 senses (detects) connection to the connector 101, the software system indicates successful attachment. After attachment, an auto-calibration routine occurs automatically. If auto-calibration fails, the system may prompt the user to perform on-screen manual calibration. For auto-calibration to work properly, the connector 101 must be connected to the actuator unit 300, while at least part of the catheter 100 is held in (engaged with) the alignment tube 130, and the predefine shape of the catheter is unchanged. In some embodiments, one or more of the catheter package 601, the alignment tube 130, or the catheter 100 can be equipped with a safety feature, such as an NFC chip 105 shown in FIG. 3. The near-field communication (NFC) chip 105 (e.g., an RFID circuit) can be configured to provide a signal to the actuator unit 300 to indicate connection of the connector 101 to the actuation handle; the NFC chip 105 can also mark the catheter 100 as "used" after the package 601 is opened.

At step S412, the user can now remove the assembled and calibrated continuum robot 500 from the package 601 leaving on the table 90 the alignment tube 130, the hub holder 604, and the package 601. Thereafter, the user can proceed to perform a given procedure by controlling the catheter 100 via the user control unit 320 (joystick), or by mounting the continuum robot 500 on the support platform 200, and robotically controlling the catheter 100 via the software system. It will be understood by those skilled in the art that steps S402 through S412 are an example workflow of a setup procedure for the continuum robot system, and those steps are not necessarily in chronological order. The workflow of FIG. 4 can be altered without departing from the general procedure.

Advantageously, since the system has already performed a pre-setting procedure (initialization step) to place the acceptor parts 302 in a predefined position for receiving the driving wires in the predefined shape or pose of the catheter, the user can assemble the catheter 100 with the proper shape (e.g., in the embodiment of FIG. 4, A straight shape) with minimal risk to have an unexpected shape error. This is achieved by leveraging the package 601 with straight constraint of the alignment tube 130 for the catheter. In addition, by using the package 601, there is no need to add an additional part or process for shape calibration step. Furthermore, the user intervention for manually connecting the driving wires to the acceptor parts is minimized because the acceptor parts 302 are in a predefined position for receiving the driving wires in the predefined shape or pose of the catheter. Therefore, it is possible to reduce the cost of the catheter and the burden for user to manage the number of parts for setting up the catheter.

Sterile Packaging Variations

At step S404 of FIG. 4, the hub holder 604 is shown as a piece of solid material used to hold the connector 101 and the alignment tube 130, so that the connector hub 102 is presented slightly protruding from the package 601. To ensure that the connector 101 and alignment tube 130 do not move or slide back inside the package, the package 601 can be provided with small slots or cuts 605 on the edge of the package to fit the hub holder 604 in the package slots. In other embodiments, the hub holder 604 can be provided with cuts or slots 607 to be engaged with the package 601 as shown in FIG. 5A-FIG. 5C.

Figure 5A:
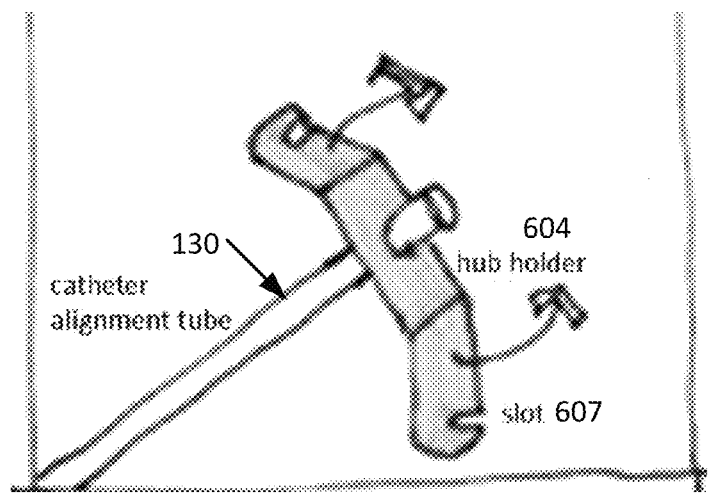
FIG. 5A-FIG. 5C illustrate various embodiments of a hub holder 604 integrated with an alignment tube 130.
Figure 5B:
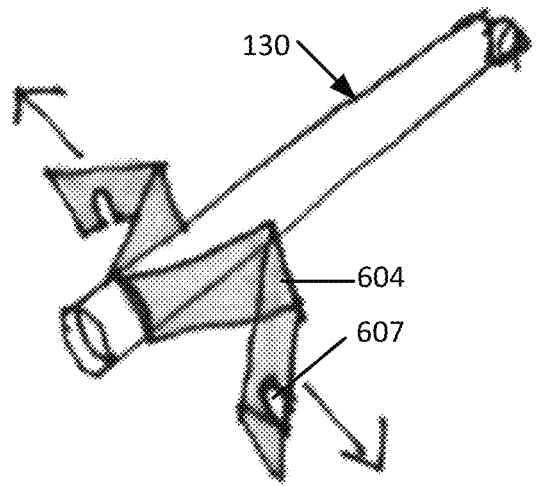
Figure 5C:
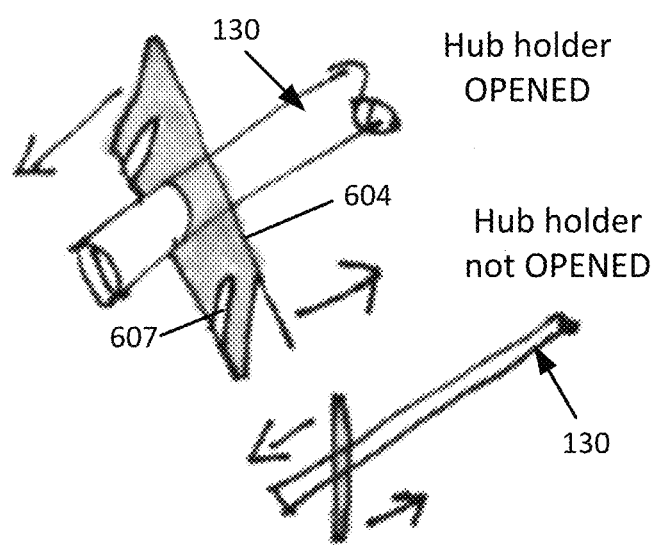

More specifically, FIG. 5A, FIG. 5B and FIG. 5C illustrate various embodiments of a hub holder 604 integrated with an alignment tube 130. FIG. 5A illustrates an embodiment of the hub holder 604 pre-assembled with the alignment tube 130. To optimize the size of packaging assembly 600, the hub holder 604 can be pleated or folded for packaging. Then, for connecting the catheter 100 to the actuator unit 300, the hub holder 604 can be unfolded (as shown in FIG. 5A), and then mounted onto the package 601 (as shown in FIG. 4: S404).

Alternately, the hub holder 604 can be folded in an accordion-like expanding structure with slots 607 configured to engage with the edges of package 601. FIG. 5B illustrates an embodiment of a hub holder 604 having an accordion-like expanding structure with slots 607. In this embodiment, the hub holder 604 can be pre-assembled (attached with an adhesive or laser welded) with the alignment tube 130, and folded parallel to the tube. In this manner, the size (width) of the package 601 can be minimized.

In another embodiment, as shown in FIG. 5C, the hub holder 604 can be a straight piece of material longer than the width of the package 601. In this case, the hub holder 604 can be pre-assembled with the alignment tube 130 with certain tolerance, so that the hub holder 604 can be packed diagonally at an angle with respect to the length of the tube 130. Then, at step S404, to place the hub holder 604 on the edges of the package 601, the user can move the ends of the hub holder 604 such that the slots 607 engage with the parallel walls of the package 601. FIG. 5C shows the hub holder 604 mounted on the alignment tube 130 in an unopened state and in an opened state. At first, in the unopened state, the hub holder 604 is packaged diagonally (at an angle with respect to the tube 130). Then, at the time of connecting the catheter, the hub holder 604 is moved so as to be substantially perpendicular to the alignment tube 130.

Advantageously, in both of the concepts in FIG. 5A and FIG. 5B, the intent is that slots 607 attach to sides of the package 601. Once attached, the whole hub holder 604 should be in tension and not be allowed to return to the folded position, thereby preventing possible misalignment or movement of the alignment tube 130 when the actuator unit 300 is connected to the catheter. Similarly, having the hub holder 604 without any folds maintains stiffness of the hub holder, and can be advantageous in preventing possible misalignment or restricting movement of the alignment tube 130 when the actuator unit 300 is connected to the catheter.

In at least one embodiment, the catheter 100 can include an imaging device (a camera) or a tool (end effector) preassembled into the tool channel 150 of the catheter. In such embodiment, the hub holder 604 and the alignment tube 130 can be appropriately designed to withstand the weight and maintain sterility of the preassembled components. When a camera is pre-assemble in the catheter 100, cables for powering the camera are necessary; therefore, cable connector ends of the camera are provided through the connector 101. In this case, at step S410 after assembling the actuator unit 300 with the catheter 100, the user can connect the cable connector ends of the camera to the system's console 400 to confirm the system is functioning properly.

Constrained Catheter Shape

FIG. 6 illustrates another embodiment of the alignment tube 130 configured to constrain the steerable catheter 100 to a curved (non-linear) posture or shape. The curved shape may comprise a coiled shape, a c-shape, a u-shape, or an s-shape. In this embodiment, the packaging assembly 600 includes a substantially square tray-like structure that serves as a protective housing or package 601 where the alignment tube 130 is placed in a curved shape instead of a straight shape. The catheter 100 is arranged inside the alignment tube 130 and constrained to the same curved shape of the alignment tube 130. As it can be appreciated from FIG. 6, the connecting rods 103 are displaced from each other (are not at the same plane) due to the bending of the alignment tube 130 and catheter 100.

Therefore, according to the embodiment shown in FIG. 6, the CPU 410 of the system 1000 can be programmed to set the acceptor parts 302 of the actuator unit 300 to the appropriate positions expecting to receive the catheter 100 in a curved shape inside the alignment tube 130. By following the same workflow as shown in FIG. 4, the user can assemble the catheter with the actuation handle with minimal risk of unexpected shape error.

More specifically, the catheter 100 is inserted in the alignment tube 130 and placed in the package 601 coiled in a substantially circular shape. At the proximal end of the catheter 100, the connector 101 passes the driving wires 210 to be attached to connecting rods 103. The driving wires 210 span through the wall of the catheter and are terminated at the distal end of the bending sections. The body of catheter 100 is attached to the connector 101, while the driving wires 210 slide against the body of catheter 100 and connector 101.

With the shape of alignment tube 130, the connecting rods 103 (free ends) of driving wires 210 take different positions accordingly. The positions of the connecting rods 103 can be determined or calculated prior to connecting the catheter 100 to the actuator unit 300 based on the dimension design parameters of catheter 100 and the shape of the alignment tube 130. Therefore, in this embodiment, the curved shape of the catheter 100 as arranged in the sterile packaging can be factored in the initialization procedure even before opening the sterile packaging assembly.

Advantageously, since the catheter is packaged in a curved shape, the size (length) of the package can be reduced. This would be beneficial for optimizing storage space, for facilitating transportation, and for maneuvering the catheter in small and congested spaces, such as on the operating table or patient's bed. In addition, the shorter length makes the user's handling of the packaging assembly easier, and makes catheter connection and packaging removal more efficient.

Although FIG. 6 is showing the curved shape with a three quarter turn, the package can hold a catheter having one whole turn or having several turns in a coil that spirals from outside to inside. In a coiled catheter, the alignment tube 130 can be shorter than the catheter. For example, the alignment tube 130 can have a curved shape with a three quarter turn, while the catheter 100 can have several turns in a coil that spirals from outside to inside. In this case, the alignment tube 130 holds a section (the proximal section or the distal section) of the catheter in a curved shape (the desired shape) before connecting the connector 101 to the actuator unit 300.

Software Related Disclosure

At least certain aspects of the exemplary embodiments described herein can be realized by a computer of a system or apparatus that reads out and executes computer executable instructions (e.g., one or more programs or executable code) recorded on a storage medium (which may also be referred to as a 'non-transitory computer-readable storage medium') to perform functions of one or more block diagrams, processes, or flowchart diagrams described above. The computer may include various components known to a person having ordinary skill in the art. For example, the computer may include a signal processor implemented by one or more circuits (e.g., a field programmable gate array (FPGA) or an application specific integrated circuit (ASIC)) for performing the functions of one or more of the above-described embodiment(s), by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)), and may include a network of separate computers or separate processors to read out and execute the computer executable instructions. The computer executable instructions may be provided to the computer, for example, from a cloud-based network or from the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like. The computer may include an input/output (I/O) interface to receive and/or send communication signals (data) to input and output devices, which may include a keyboard, a display, a mouse, a touch screen, touchless interface (e.g., a gesture recognition device) a printing device, a light pen, an optical storage device, a scanner, a microphone, a camera, a drive, communication cable and a network (either wired or wireless). In at least one embodiment, an apparatus for use in a robotic control system for manipulating a steerable catheter, comprises: an electronic controller; a computer-readable memory coupled to the electronic controller; and computer-executable instructions stored in the memory. The computer-executable instructions includes control logic written as programmed code and configured to be executed by the electronic controller (e.g., a CPU of the system 1000) to produce an actuation control signal to control movement of one or more actuators of the actuator unit 300 so as to place each acceptor part 302 to an initial position to receive the connecting rods 103 based on a predetermined shape of the steerable catheter.

Other Embodiments and Modifications

In the embodiments described above, a novel catheter packing design provides several advantages and new features over conventional catheter packaging. According to the new design described herein, an alignment tube which is integral part of the catheter packaging, keeps the steerable catheter in a predetermined shape; the predetermined shape is configured to match a calibrated state of acceptor parts in an actuation handle during the process of assembling the catheter with the actuation handle. The system is configured to complete an initialization process to set the acceptor parts of the actuation handle to a position corresponding to the predetermined shape in which the catheter is packaged. Therefore, no additional parts or processes for shape calibration are necessary.

An advantageous differentiator in the novel catheter packing design is the mating interface (connector hub 102) configured to present the proximal ends of driving wires 210 for connection to the actuation handle (actuation unit 300). Furthermore, the novel packaging design comprising the hub holder 604 integrated with an alignment tube 130 achieves improved connection of the steerable catheter to the actuation handle (process shown in FIGS. 5A-5C) through a means which will not necessitate a larger package. The steerable catheter will not need a package with a protrusion or odd shaped forms to accommodate an upturned connector hub 102—which could create challenges in making stackable packages for shipment/storage. The novel catheter packing design allows for the storage of the steerable catheter in a substantially rectangular shape with straight edges, which is advantages not only for improved connection of the driving wires of the steerable catheter to the actuation handle, but also for tidy storage of the rectangular packages.

With the new packaging design, it is possible to maintain the shape of the catheter after manufacturing until just before its use with minimal risk to damage the catheter. The catheter is kept clean until removed from the alignment tube for use. The alignment tube presents the connector hub of the catheter for attachment to the actuation handle without removing the catheter from its sterile packaging. The packaging keeps the catheter clean until immediately before being pulled from the alignment tube, after the catheter has been attached to the actuation handle. In other words, the catheter is held in the alignment tube constrained to a predetermined shape until the catheter is ready for use.

Alternate embodiments and methods of using the novel catheter packaging design can be implemented as follows. An alternate embodiment 1 is a system comprising: a packaging assembly comprising an alignment member; and a steerable catheter arranged in the packaging assembly such that at least a proximal section of the steerable catheter is enclosed in the alignment member; wherein the proximal section of the steerable catheter is configured to be aligned for connection with an actuator unit of a robotic system, wherein the alignment member constrains the steerable catheter to a predetermined shape, and wherein the alignment member aligns the proximal section of the steerable catheter for connection to the actuator unit without changing the predetermined shape of the steerable catheter and while the proximal section of the steerable catheter remains at least partially enclosed within the alignment member.

The system according to alternate embodiment 1, further comprising: a memory storing information about the predetermined shape of the steerable catheter. The system according to alternate embodiment 1, further comprising: a controller configured to initialize the actuator unit based on the information about the predetermined shape of the steerable catheter. The system according to alternate embodiment 1, wherein the steerable catheter includes one or more driving wires configured to change the predetermined shape of the steerable catheter, wherein the actuator unit includes one or more actuators configured to move acceptor parts for the driving wires, and wherein the controller initializes the actuator unit by controlling the one or more actuators of the actuator unit to move the acceptor parts for the driving wires to a position for the predetermined shape of the steerable catheter.

The system according to alternate embodiment 1, wherein the controller is further configured to, after confirming that the actuator unit has been initialized, prompt a user to connect the proximal section of the steerable catheter to the initialized actuator unit.

An alternate embodiment 2 is a packaging assembly for storing a steerable catheter ready for connection with an actuator unit, the packaging assembly comprising: an alignment member configured to hold at least a proximal portion of the steerable catheter in a predetermined posture; and an alignment member configured to align the steerable catheter for connection with an actuator unit, wherein the alignment member constrains the steerable catheter to the predetermined posture while the actuator unit connects to a proximal section of the steerable catheter without changing the predetermined posture thereof.

The packaging assembly according to alternate embodiment 2, wherein the alignment member includes an alignment tube having a shape consistent with the predetermined posture of the steerable catheter, and wherein, after connection, the steerable catheter connected to the actuator unit is removable from the alignment tube without changing the shape of the alignment tube.

The packaging assembly according to alternate embodiment 2, wherein the steerable catheter includes one or more drive wires configured to actuate a distal section of the steerable catheter, and wherein the actuator unit uses data about the predetermined posture of the steerable catheter to initialize acceptor parts of the actuator unit configured to engage with proximal ends of the one or more drive wires.

The packaging assembly according to alternate embodiment 2, wherein the one or more drive wires are arranged in a connector hub at the proximal end of the steerable catheter, and the drive wires are spanned in a lengthwise direction through the connector hub and the proximal section towards the distal end of the steerable catheter.

An alternate embodiment 3 is a sterile packaging assembly for removably storing an elongated medical device, the sterile packaging assembly comprising: an alignment member configured to hold the elongated medical device in a predetermined posture; and an package configured to contain the alignment member with the elongated medical device; wherein the alignment member is configured to be removed after connecting the elongated medical device with an actuator unit without changing the predetermined posture of the elongated medical device.

An alternate embodiment 4 includes a robotic system configured to connect to the elongated medical device included in the sterile packaging assembly according to alternate embodiment 3, the robotic system comprising: a controller configured to command the actuation unit to change the posture of the elongated medical device.

The robotic system according to alternate embodiment 4, further comprising a memory configured to store information about the predetermined posture of the elongated medical device, wherein the controller controls the actuation unit according to the stored information about the predetermined posture to initialize the actuation unit before connecting the elongated medical device with the alignment member. The robotic system according to alternate embodiment 4, wherein the controller initializes the actuation unit based on the predetermined posture of the elongated medical device.

In referring to the description, specific details are set forth in order to provide a thorough understanding of the examples disclosed. In some instances, well-known methods, procedures, components and circuits have not been described in detail as not to unnecessarily lengthen the present disclosure. Unless defined otherwise herein, all technical and scientific terms used herein have the same meaning as commonly understood by persons of ordinary skill in the art to which this disclosure belongs. In that regard, the breadth and scope of the present disclosure is not limited by the specification or drawings, but rather only by the plain meaning of the claim terms employed including all equivalents. Changes may be made in details, particularly in matters of shape, size, and rearrangement of steps without departing from the scope of the present disclosure. Changes may include, to the extent that is appropriate, the use any features of one embodiment in other embodiments. Therefore, the scope of the following claims is to be accorded the broadest interpretation so as to encompass all such modifications and equivalent structures and functions.

Any patent, pre-grant patent publication, or other publication, in whole or in part, that is said to be incorporated by reference herein is incorporated only to the extent that the incorporated material does not conflict with standard definitions or terms, or with statements and descriptions set forth in the present disclosure. As such, and to the extent necessary, the disclosure as explicitly set forth herein supersedes any conflicting material incorporated by reference.

What is claimed is:

1. A packaging assembly for storing a steerable catheter ready to connect to a robotic system, the assembly comprising:
   a steerable catheter having a catheter body that extends lengthwise from a proximal end to a distal end, the steerable catheter having one or more bendable segments actuatable by a plurality of driving wires that are arranged along a wall of the catheter body, wherein distal ends of the plurality of driving wires are attached to the one or more bendable segments and proximal ends of the plurality of driving wires protrude through the proximal end of the catheter body and are connectable to an actuation unit;
   an alignment member having a surface of a predetermined shape and configured to engage with the wall of the catheter body; and
   a packaging enclosure configured to enclose the alignment member and the catheter body releasably engaged to each other,
   wherein the alignment member is arranged in the packaging enclosure so as to constrain at least part of the catheter body to the predetermined shape, and
   wherein, to connect the steerable catheter to an actuation unit of the robotic system, the packaging enclosure presents the proximal ends of the plurality of driving wires in an arrangement preconfigured for connection with the actuation unit.

2. The packaging assembly according to claim 1, wherein the predetermined shape is a straight shape or a curved shape, and the arrangement preconfigured for connection with the actuation unit includes an arrangement where the proximal ends of the plurality of driving wires are symmetrically distributed about a longitudinal axis of the catheter body.

3. The packaging assembly according to claim 1, wherein the predetermined shape is a curved shape, and the arrangement preconfigured for connection with the actuation unit includes an arrangement where the proximal ends of the plurality of driving wires are longitudinally offset from each other.

4. The packaging assembly according to claim 1, wherein the predetermined shape is a curved shape, and the arrangement preconfigured for connection with the actuation unit includes an arrangement where the proximal ends of the plurality of driving wires are longitudinally at a same distance from the proximal end of the steerable catheter.

5. The assembly according to claim 1, wherein the packaging enclosure includes at least one of a tray, a box, or a mounting card, with the at least one of the tray, the box, or the mounting card made of sterilizable material.

6. The assembly according to claim 1, wherein the packaging enclosure has a bottom surface, a raised edge connected to and surrounding the bottom surface, and a top web adhesively attached to the raised edge opposite to the bottom surface.

7. The packaging assembly according to claim 6, further comprising:
   a hub holder attached or attachable to the raised edge of the packaging enclosure,
   wherein the hub holder is configured to hold the alignment member at a distance from the bottom surface such that the proximal ends of the plurality of driving wires are raised above the raised edge of the packaging enclosure so as to facilitate the connecting of the plurality of driving wires with the actuation unit without removing the steerable catheter from the alignment member or the packaging enclosure.

8. The assembly according to claim 1,
   wherein the alignment member includes a carrier tube having an inner surface configured to releasably engage with the wall of the catheter body, and
   wherein the carrier tube has a tubular shape that constrains the at least part of the catheter body to the predetermined shape.

9. The assembly according to claim 8, wherein the predetermined shape of the carrier tube is a straight shape, and wherein the carrier tube constrains the least part of the steerable catheter to the straight shape.

10. The packaging assembly according to claim 8, wherein the predetermined shape of the carrier tube is a curved shape, and wherein the carrier tube constrains the least part of the catheter body to the curved shape.

11. A method of packaging a steerable catheter ready for connection to a robotic system, the method comprising:
    providing a steerable catheter that extends lengthwise from a proximal end to a distal end, the steerable catheter having one or more bendable segments actuatable by a plurality of driving wires that are arranged along a wall of the steerable catheter, wherein distal ends of the plurality of driving wires are attached to the one or more bendable segments and proximal ends of the plurality of driving wires protrude through the proximal end of the steerable catheter and are connectable to an actuation unit;
    arranging the steerable catheter within an alignment member that has a surface of a predetermined shape, and the surface is configured to engage with the wall of the steerable catheter; and
    packaging, in a packaging enclosure, the alignment member and the steerable catheter releasably engaged to each other,
    wherein the alignment member is arranged in the packaging enclosure so as to constrain at least part of the steerable catheter to the predetermined shape of the alignment member, and
    wherein, for connecting the steerable catheter to an actuation unit of the robotic system, the packaging enclosure presents the proximal ends of the plurality of driving wires in an arrangement preconfigured for connection with the actuation unit.

12. The method according to claim 11, further comprising:
storing information about the predetermined shape of the steerable catheter in a memory of the robotic system.

13. The method according to claim 12, further comprising:
initializing the actuator unit based on the information about the predetermined shape of the steerable catheter.

14. The method according to claim 13,
wherein the steerable catheter includes one or more driving wires configured to change the predetermined shape of the steerable catheter,
wherein the actuator unit includes one or more actuators configured to move acceptor parts for the driving wires, and
wherein initializing the actuator unit includes controlling the one or more actuators of the actuator unit to move the acceptor parts for the driving wires to a position for the predetermined shape of the steerable catheter.

15. The method according to claim 14, further comprising:
connecting the proximal section of the steerable catheter to the initialized actuator unit.

16. The method according to claim 15, further comprising:
removing the steerable catheter connected to the actuator unit from the alignment member.

17. The method according to claim 15, further comprising:
controlling the one or more actuators of the actuator unit to move the acceptor parts for the driving wires to change the predetermined shape of the steerable catheter.

18. The method according to claim 17, further comprising:
partially removing the steerable catheter from the alignment member while maintaining the predetermined shape of the steerable catheter.

19. The method according to claim 17, further comprising:
arranging an imaging device or an end effector tool in a lumen.

20. The method according to claim 11,
wherein, the steerable catheter is configured to be partially removed from the alignment member while maintaining the predetermined shape of the steerable catheter, and
wherein, while being partially removed, the steerable catheter and the alignment member are maintained in sterile packaging.

* * * * *